United States Patent
Rickerby et al.

(10) Patent No.: US 9,963,774 B2
(45) Date of Patent: May 8, 2018

(54) METHOD OF APPLYING A THERMAL BARRIER COATING TO A METALLIC ARTICLE AND A THERMAL BARRIER COATED METALLIC ARTICLE

(71) Applicant: ROLLS-ROYCE PLC, London (GB)

(72) Inventors: David Stafford Rickerby, Derby (GB); Robert Edward Jones, Sheffield (GB); Christine Chalk, Crawley (GB)

(73) Assignee: ROLLS-ROYCE plc, London (GB)

( * ) Notice: Subject to any disclaimer, the term of this patent is extended or adjusted under 35 U.S.C. 154(b) by 482 days.

(21) Appl. No.: 14/836,502

(22) Filed: Aug. 26, 2015

(65) Prior Publication Data

US 2016/0083833 A1 Mar. 24, 2016

(30) Foreign Application Priority Data

Sep. 19, 2014 (GB) .................................. 1416585.6

(51) Int. Cl.
*C25D 5/50* (2006.01)
*C23C 14/08* (2006.01)
(Continued)

(52) U.S. Cl.
CPC ............ *C23C 14/081* (2013.01); *B23K 15/00* (2013.01); *B23K 15/0006* (2013.01);
(Continued)

(58) Field of Classification Search
None
See application file for complete search history.

(56) References Cited

U.S. PATENT DOCUMENTS 4,321,310 A * 3/1982 Ulion .................... C23C 14/024
428/612
5,538,796 A * 7/1996 Schaffer .................. C23C 14/02
148/675

(Continued)

FOREIGN PATENT DOCUMENTS

DE 102005050873 A1 4/2007
EP 718419 A2 6/1996
(Continued)

OTHER PUBLICATIONS

Jun. 10, 2015 Search Report issued in Great Britain Patent Application No. GB1416585.6.
(Continued)

*Primary Examiner* — Peter A Salamon
(74) *Attorney, Agent, or Firm* — Oliff PLC

(57) ABSTRACT

A thermal barrier coated metallic article includes a platinum-group metal enriched outer layer on the article. The surface of the outer layer has a microstructure including a plurality of projections extending away from the metallic article. A thin adherent layer of oxide is formed on the outer layer of the metallic article. A ceramic coating is provided on the oxide layer on the surface on and around the projections. The ceramic coating includes a plurality of columnar ceramic grains which extend through the full thickness of the ceramic coating. The grains are arranged in clusters separated by gaps. The grains deposited around the projections are generally blocked. The projections reduce the stress in the ceramic coating near the interface with the adherent layer of oxide and also reduce the stress in the adherent layer of oxide and hence increase the working life of the thermal barrier coating system.

20 Claims, 7 Drawing Sheets

(51) Int. Cl.
  C23C 14/30    (2006.01)
  C23C 28/00    (2006.01)
  F01D 5/28     (2006.01)
  C23C 4/11     (2016.01)
  B23K 26/00    (2014.01)
  C22F 1/00     (2006.01)
  C22F 1/10     (2006.01)
  C25D 7/00     (2006.01)
  B23K 15/00    (2006.01)
  B23K 26/08    (2014.01)
  B23K 26/354   (2014.01)
  B23K 101/00   (2006.01)
  B23K 101/34   (2006.01)
  B23K 103/18   (2006.01)

(52) U.S. Cl.
  CPC ...... *B23K 26/0006* (2013.01); *B23K 26/0081* (2013.01); *B23K 26/0084* (2013.01); *B23K 26/08* (2013.01); *B23K 26/354* (2015.10); *C22F 1/008* (2013.01); *C22F 1/10* (2013.01); *C23C 4/11* (2016.01); *C23C 14/08* (2013.01); *C23C 14/083* (2013.01); *C23C 14/30* (2013.01); *C23C 28/321* (2013.01); *C23C 28/3215* (2013.01); *C23C 28/345* (2013.01); *C23C 28/347* (2013.01); *C23C 28/3455* (2013.01); *C25D 5/50* (2013.01); *C25D 7/008* (2013.01); *F01D 5/288* (2013.01); *B23K 2201/001* (2013.01); *B23K 2201/34* (2013.01); *B23K 2203/26* (2015.10); *F05D 2230/313* (2013.01); *F05D 2230/40* (2013.01); *F05D 2230/90* (2013.01); *F05D 2300/143* (2013.01); *F05D 2300/175* (2013.01); *F05D 2300/2118* (2013.01)

(56) References Cited

U.S. PATENT DOCUMENTS

| | | | | |
|---|---|---|---|---|
| 5,645,893 A | * | 7/1997 | Rickerby | C23C 14/083 148/277 |
| 5,667,663 A | * | 9/1997 | Rickerby | C23C 14/083 148/277 |
| 5,981,091 A | * | 11/1999 | Rickerby | C23C 14/083 428/548 |
| 6,110,604 A | * | 8/2000 | Rickerby | C23C 14/08 204/192.1 |
| 6,210,812 B1 | * | 4/2001 | Hasz | C22C 38/005 416/241 B |
| 6,221,512 B1 | * | 4/2001 | Rickerby | C23C 14/083 416/241 B |
| 6,482,469 B1 | * | 11/2002 | Spitsberg | C23C 4/02 427/250 |
| 6,576,067 B2 | * | 6/2003 | Spitsberg | C22F 1/10 148/277 |
| 7,740,948 B1 | * | 6/2010 | Alvin | C23C 10/52 416/241 B |
| 2002/0094447 A1 | * | 7/2002 | Spitsberg | C23C 8/80 428/632 |
| 2006/0127695 A1 | * | 6/2006 | Gleeson | C23C 10/02 428/670 |

FOREIGN PATENT DOCUMENTS

| | | |
|---|---|---|
| EP | 718420 A1 | 6/1996 |
| EP | 0845547 A1 | 6/1998 |
| EP | 0902104 A2 | 3/1999 |
| EP | 0940480 A1 | 9/1999 |
| EP | 0964077 A2 | 12/1999 |
| EP | 1094131 A2 | 4/2001 |
| EP | 1536039 A1 | 6/2005 |
| EP | 1788108 A1 | 5/2007 |
| GB | 2061397 A | 5/1981 |
| WO | 99/18259 A1 | 4/1999 |

OTHER PUBLICATIONS

Lipkin, D.M. et al., "Measurement of the Stresses in Oxide Scales Formed by Oxidation of Alumina-Forming Alloys," Oxidation of Metals, vol. 45, No. 3-4, (1996), pp. 267-280.

Zhoa, X. et al., "Residual Stresses in Thermal barrier coatings Measured by Photoluminescence Piezospectroscopy and Indentation Technique," Surface and Coatings Technology, vol. 201, (2006), pp. 1124-1131.

Feb. 2, 2016 Extended Search Report issued in European Patent Application No. 15182450.5.

* cited by examiner

Creation of a taper section to allow for measurement of the stress gradient in the TGO layer

METHOD OF APPLYING A THERMAL BARRIER COATING TO A METALLIC ARTICLE AND A THERMAL BARRIER COATED METALLIC ARTICLE

FIELD OF THE INVENTION

The present disclosure relates to a method of applying a thermal barrier coating to a metallic article and to a thermal barrier coated metallic article and in particular relates to a method of applying a thermal barrier coating to a superalloy article and to a thermal barrier coated superalloy article.

BACKGROUND TO THE INVENTION

High-pressure superalloy turbine blades, or turbine vanes, of gas turbine engines utilise a combination of internal cooling, external cooling and a ceramic thermal barrier coating (TBC) in order to lower the temperature of the substrate temperature of the superalloy turbine blades, or turbine vanes, to allow them to operate effectively within the high-pressure turbine of the gas turbine engine with minimal degradation. Ceramic thermal barrier coatings are deposited by plasma spraying or by electron beam physical vapour deposition (EBPVD).

In order to maintain adhesion of an electron beam physical vapour deposited (EBPVD) ceramic thermal barrier coating (TBC) for the life of the turbine blade, or turbine vane, a bond coating which forms a dense adherent and slow-growing oxide, e.g. alumina, bonding layer is required as an intermediate layer between the superalloy substrate of the turbine blade, or turbine vane, and the ceramic thermal barrier coating.

The bond coatings are generally either overlay coatings, e.g. MCrAlY bond coatings where M is one or more of nickel, cobalt and iron, Cr is chromium, Al is aluminium and Y is one or more of yttrium, ytterbium, lanthanum and other rare earth metals, or aluminide bond coatings. The aluminide bond coatings may for example comprise a simple aluminide bond coating, a chromium aluminide bond coating, a platinum aluminide bond coating or a chromium platinum aluminide bond coating. MCrAlY coating are generally deposited by thermal spraying or electron beam physical vapour deposition and aluminide coatings are generally deposited by chemical vapour deposition, e.g. pack aluminising, out of pack aluminising, slurry aluminising, etc.

A further bond coating comprises a platinum enriched surface layer on the superalloy substrate comprising platinum enriched gamma phase and platinum enriched gamma prime phase. Another bond coating comprises an overlay, e.g. MCrAlY, coating, a platinum enriched outer overlay layer and a platinum aluminide layer on the platinum enriched overlay layer. The platinum is generally deposited by electroplating and is diffusion heat treated.

Conventionally, the surface of the bond coating is prepared before the ceramic thermal barrier coating is applied by electron beam physical vapour deposition (EBPVD) to improve the adhesion of the ceramic thermal barrier coating to the bond coating and hence increase the working life of the ceramic thermal barrier coating. The surface of the bond coating is made smooth, by polishing or grit blasting, so that a uniform adherent oxide, e.g. alumina, bonding layer is formed.

The present disclosure seeks to provide a novel thermal barrier coated superalloy article which has an improved working life.

The present invention seeks to provide a novel method of applying a thermal barrier coating to a superalloy article to produce a thermal barrier coated article which has an improved working life.

STATEMENTS OF INVENTION

Accordingly the present disclosure provides a thermal barrier coated metallic article, the surface of the metallic article having a plurality of projections extending away from the metallic article, a thin adherent layer of oxide on the metallic article, a ceramic coating on the oxide layer on the surface of the metallic article on and around the projections, the ceramic coating comprising a plurality of columnar ceramic grains extending substantially perpendicularly away from the metallic article, a plurality of the columnar ceramic grains nucleating on and extending from the oxide layer on the projections on the metallic article, a plurality of the columnar ceramic grains nucleating on and extending from the oxide layer around the projections on the metallic article, a plurality of the columnar ceramic grains extending from the oxide layer on the projections on the metallic article extending through the full thickness of the ceramic coating, a plurality of the columnar ceramic grains extending from the oxide layer around the projections on the metallic article only extending part way through the full thickness of the ceramic coating, one or more columnar ceramic grains growing from each projection, the columnar ceramic grains growing together from a respective one of the projections being arranged in a cluster of columnar ceramic grains and the clusters of columnar ceramic grains being separated by gaps.

A bond coating may be provided on the metallic article, the surface of the bond coating on the metallic article having the plurality of projections extending away from the metallic article and the thin adherent layer of oxide being on the bond coating.

The bond coating may comprise a platinum-group metal enriched outer layer on the metallic article, the surface of the platinum-group metal enriched outer layer on the metallic article having a microstructure comprising a plurality of projections extending away from the metallic article, the thin adherent layer of oxide being on the platinum-group metal enriched outer layer of the metallic article, the ceramic coating being on the oxide layer on the surface of the platinum-group metal enriched outer layer.

At least some of the projections may extend between 10 µm and 25 µm from the surface of the bond coating immediately adjacent to the corresponding projections.

The metallic article may comprise a superalloy substrate, the superalloy substrate comprises a gamma phase and gamma prime phase, the platinum-group metal enriched outer layer comprises a platinum-group metal enriched gamma phase and a platinum-group metal enriched gamma prime phase.

The metallic article may comprise a superalloy substrate and an overlay coating on the superalloy substrate, the superalloy substrate comprises gamma phase and gamma prime phase, the platinum-group metal enriched outer layer comprises a platinum-group metal enriched overlay layer and a platinum-group metal aluminide layer on the platinum-group metal enriched overlay layer.

The overlay coating may comprise a MCrAlY coating.

The platinum-group metal may comprise platinum.

The bond coating may comprise an aluminide coating, a platinum aluminide coating or an overlay coating.

The metallic article may comprise a superalloy substrate.

The ceramic coating may comprise stabilised zirconia.

The ceramic coating may comprise yttria stabilised zirconia, yttria and erbia stabilised zirconia, yttria and gadolinia stabilised zirconia or yttria, erbia and gadolinia stabilised zirconia.

The metallic article may be a nickel based superalloy or a cobalt based superalloy.

The nickel based superalloy or a cobalt based superalloy may consist of less than 1 ppm weight of sulphur.

The metallic article may be a turbine blade or a turbine vane.

There may be between and including 10 and 45 clusters of columnar ceramic grains per mm at the surface of the ceramic coating. There may be between 30 and 43 clusters of columnar ceramic grains per mm at the surface of the ceramic coating.

The oxide layer may have an as formed stress of less than 3.0 GPa. The ceramic coating may have a stress of less than 0.25 GPa at distances greater than 30 μm from the oxide layer and a stress of about 0.50 GPa at the oxide layer.

The present disclosure also provides a method of applying a thermal barrier coating to a metallic article comprising the steps of:—
(a) providing a plurality of projections extending away from the surface of the metallic article,
(b) creating a thin adherent layer of oxide on the metallic article, and
(c) applying a ceramic coating to the oxide layer on the surface of the metallic article such that the ceramic coating deposits on the surface of the metallic article on and around the projections, applying the ceramic coating as a plurality of columnar ceramic grains extending substantially perpendicularly away from the metallic article, a plurality of the columnar ceramic grains nucleating on and extending from the oxide layer on the projections on the metallic article, a plurality of the columnar ceramic grains nucleating on and extending from the oxide layer around the projections on the metallic article, a plurality of the columnar ceramic grains extending from the oxide layer on the projections on the metallic article extending through the full thickness of the ceramic coating, a plurality of the columnar ceramic grains extending from the oxide layer around the projections on the metallic article only extending part way through the full thickness of the ceramic coating, one or more columnar ceramic grains growing from each projection, the columnar ceramic grains growing together from a respective one of the projections being arranged in a cluster of columnar ceramic grains and the clusters of columnar ceramic grains being separated by gaps.

Step (a) may comprise providing a bond coating on the metallic article, the surface of the bond coating on the metallic article having a plurality of projections extending away from the metallic article, step (b) comprises creating a thin adherent layer of oxide on the bond coating, and step (c) comprises applying a ceramic coating to the oxide layer on the surface of the bond coating.

Step (a) may comprise depositing a bond coating on the metallic article and forming the plurality of projections on the bond coating.

Step (a) may comprise forming the plurality of projections by power beam sculpturing.

Step (a) may comprise forming the plurality of projections by electron beam sculpturing or laser beam sculpturing.

Step (a) may comprise depositing the bond coating by applying the bond coating by electroplating and then heat treating the bond coating.

The method may consist of the steps of:—
(a) applying a layer of platinum-group metal to the metallic article, applying the platinum-group metal by an electroplating process, heat treating the platinum-group-metal coated metallic article to diffuse the platinum-group metal into the metallic article to create a platinum-group metal enriched outer layer on the metallic article, the surface of the platinum-group metal enriched outer layer on the metallic article having a microstructure comprising a plurality of projections extending away from the metallic article,
(b) creating a thin adherent layer of oxide on the platinum-group metal enriched outer layer of the metallic article, and
(c) applying a ceramic coating to the oxide layer on the surface of the bond coating such that the ceramic coating deposits on the surface of the bond coating on and around the projections, applying the ceramic coating as a plurality of columnar ceramic grains extending substantially perpendicularly away from the metallic article, a plurality of the columnar ceramic grains nucleating on and extending from the oxide layer on the projections on the bond coating, a plurality of the columnar ceramic grains nucleating on and extending from the oxide layer around the projections on the bond coating, a plurality of the columnar ceramic grains extending from the oxide layer on the projections on the bond coating extending through the full thickness of the ceramic coating, a plurality of the columnar ceramic grains extending from the oxide layer around the projections on the bond coating only extending part way through the full thickness of the ceramic coating, one or more columnar ceramic grains growing from each projection, the columnar ceramic grains growing together from a respective one of the projections being arranged in a cluster of columnar ceramic grains and the clusters of columnar ceramic grains being separated by gaps.

At least some of the projections may extend between 10 μm and 25 μm from the surface of the platinum enriched surface layer immediately adjacent to the corresponding projections.

The metallic article may comprise a superalloy substrate, the superalloy substrate comprises a gamma phase and gamma prime phase, the platinum-group metal enriched outer layer comprises a platinum-group metal enriched gamma phase and a platinum-group metal enriched gamma prime phase.

The metallic article may comprise a superalloy substrate and an overlay coating on the superalloy substrate, the superalloy substrate comprises gamma phase and gamma prime phase, the platinum-group metal enriched outer layer comprises a platinum-group metal enriched overlay layer and a platinum-group metal aluminide layer on the platinum-group metal enriched overlay layer.

The heat treatment may be carried out at a temperature in the range of 1100° C. to 1200° C. dependent upon the solution heat treatment temperature appropriate for the superalloy article.

The platinum-group metal may comprise platinum.

The thickness of the layer of platinum as applied before heat treatment may be greater than 3 μm and less than 12.5 μm.

The heat treatment may be carried out for one hour.

The thin adherent layer of oxide may be created by heating the platinum-group metal enriched outer layer in an oxygen containing atmosphere.

The ceramic coating may be applied by electron beam physical vapour deposition or plasma spray physical vapour deposition.

The thin adherent layer of oxide may be created during the process of electron beam physical vapour deposition.

The ceramic coating may comprise stabilised zirconia.

The ceramic coating may comprise yttria stabilised zirconia, yttria and erbia stabilised zirconia, yttria and gadolinia stabilised zirconia or yttria, erbia and gadolinia stabilised zirconia.

The metallic article may be a nickel based superalloy or a cobalt based superalloy.

The nickel based superalloy or a cobalt based superalloy may consist of less than 1 ppm weight of sulphur.

The metallic article may be a turbine blade or a turbine vane.

There may between and including 10 and 45 clusters of columnar ceramic grains per mm at the surface of the ceramic coating. There may be between 30 and 43 clusters of columnar ceramic grains per mm at the surface of the ceramic coating.

The oxide layer may have an as formed stress of less than 3.0 GPa. The ceramic coating may have a stress of less than 0.25 GPa at distances greater than 30 μm from the oxide layer and a stress of about 0.50 GPa at the oxide layer.

BRIEF DESCRIPTION OF THE DRAWINGS

The present invention will be more fully described by way of example with reference to the accompanying drawings, in which:—

DETAILED DESCRIPTION

Figure 1:
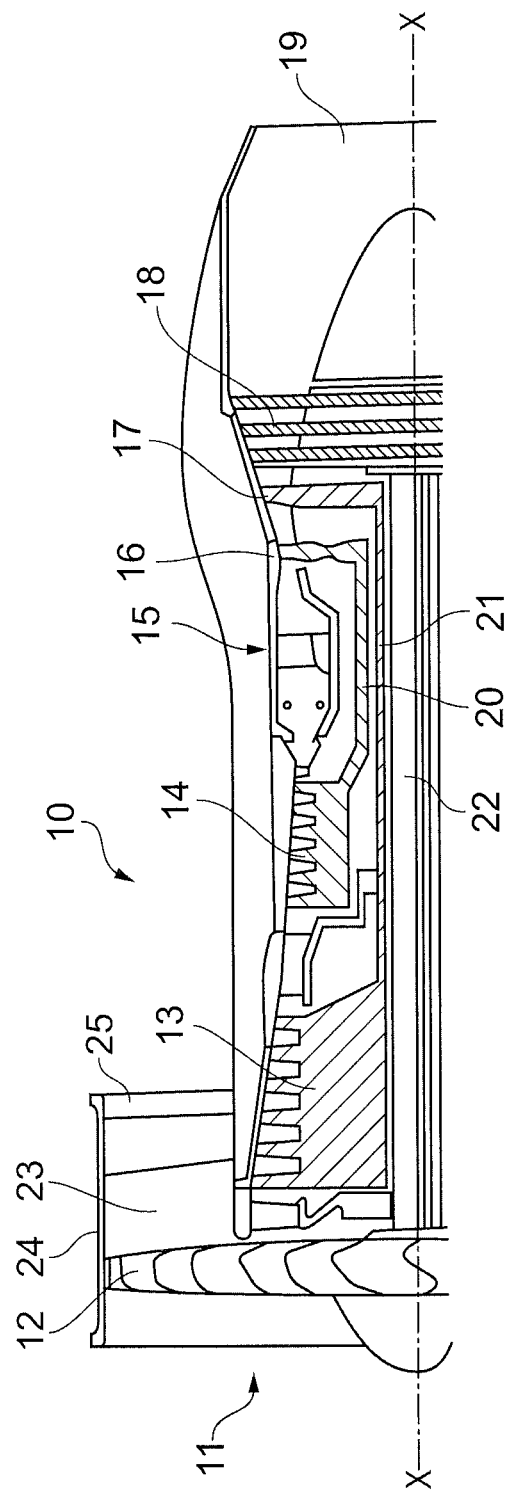
FIG. 1 is partially cut away view of a turbofan gas turbine engine having a thermal barrier coated metallic article according to the present disclosure.

A turbofan gas turbine engine 10, as shown in FIG. 1, comprises in flow series an intake 11, a fan 12, an intermediate pressure compressor 13, a high pressure compressor 14, a combustion chamber 15, a high pressure turbine 16, an intermediate pressure turbine 17, a low pressure turbine 18 and an exhaust 19. The high pressure turbine 16 is arranged to drive the high pressure compressor 14 via a first shaft 20. The intermediate pressure turbine 17 is arranged to drive the intermediate pressure compressor 13 via a second shaft 21 and the low pressure turbine 18 is arranged to drive the fan 12 via a third shaft 22. In operation air flows into the intake 11 and is compressed by the fan 12. A first portion of the air flows through, and is compressed by, the intermediate pressure compressor 13 and the high pressure compressor 14 and is supplied to the combustion chamber 15. Fuel is injected into the combustion chamber 15 and is burnt in the air to produce hot exhaust gases which flow through, and drive, the high pressure turbine 16, the intermediate pressure turbine 17 and the low pressure turbine 18. The hot exhaust gases leaving the low pressure turbine 18 flow through the exhaust 19 to provide propulsive thrust. A second portion of the air bypasses the main engine and flows through a bypass duct 23 defined by a fan casing 24. The second portion of air leaving the bypass duct 23 flows through a bypass, or fan, nozzle 25 to provide propulsive thrust.

Figure 2:
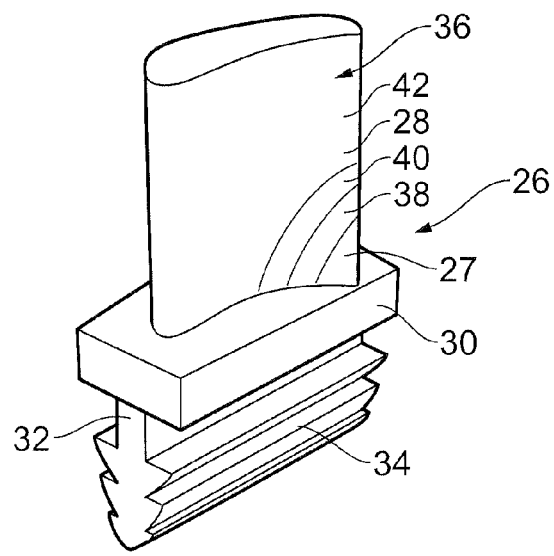
FIG. 2 is an enlarged perspective view of a thermal barrier coated metallic article according to the present disclosure.

A thermal barrier coated metallic, e.g. superalloy, article is shown in FIG. 2, the metallic, superalloy, article may be a turbine rotor blade, a turbine stator vane, an abradable seal for a turbine or a combustion chamber tile. In this example the superalloy article is a turbine rotor blade 26 which comprises an aerofoil portion 28, a platform portion 30, a shank portion 32 and a root portion 34. The turbine rotor blade 26 is positioned, in use, on a turbine rotor (not shown) in the high pressure turbine 16, the intermediate pressure turbine 17 or the low pressure turbine 18. The turbine blade 26 is provided with a multi-layer thermal barrier coating 36 at least on the surface of the aerofoil portion 28 and the radially outer surface of the platform portion 30.

Figure 3:
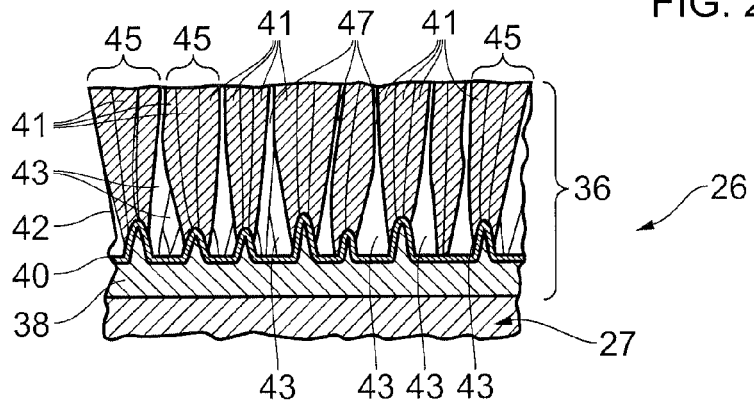
FIG. 3 is an enlarged diagrammatic cross-sectional through a thermal barrier coated metallic article according to the present disclosure.

Referring to FIG. 3, illustrating the superalloy article 26 provided with a multi-layer thermal barrier coating indicated generally by numeral 36. It is shown in the "as manufactured" condition. The thermal barrier coating 36 comprises a platinum enriched outer layer 38 on the surface of the substrate of the superalloy article 26, a thin oxide layer 40 on the platinum enriched layer 38 and a ceramic layer 42 on the thin oxide layer 40. The superalloy article 26, which forms the superalloy substrate 27 for the coating 36, is made of a nickel based superalloy or a cobalt based superalloy. The nickel based superalloy or cobalt based superalloy preferably has less than 1 ppm by weight of sulphur. More particularly, the thermal barrier coated superalloy article 26 comprises a platinum enriched outer layer 38 on the superalloy article 26, the surface of the platinum enriched outer layer 38 on the superalloy article 26 has a microstructure comprising an irregular surface including a plurality of projections 39 extending away from the superalloy article 26, a thin adherent layer of oxide 40 on the platinum enriched outer layer 38 of the superalloy article 26, a ceramic coating 42 on the oxide layer 40 on the irregular surface on and around the projections 39, and the ceramic coating 42 has a columnar grain structure comprising a plurality of columnar ceramic grains 41 and 43.

To produce the coating 36 the following procedure is followed. After thorough preparation and cleaning of the surface of the superalloy article 26 by grit blasting with fine alumina grit and degreasing, a layer of platinum 45 having a substantially constant thickness of about 10 μm was applied to the superalloy substrate 27. The thickness or the platinum layer may again vary upwards from about 3 μm, to about 12.5 μm depending upon a number of factors, such as substrate, diffusion temperatures and service conditions. In some instances the platinum layer may be up to 25 μm thick. The platinum layer 45 was applied by electroplating, but any other means could be used which will achieve a sufficient substantially uniform thickness without detriment to the material's properties. A diffusion heat treatment step was then effected so as to cause the platinum layer 45 to combine with the superalloy substrate 27. This provided the platinum enriched outer layer 38 on the superalloy substrate 27. Diffusion was achieved by heating the superalloy article 26 to a temperature of 1150° C. in a vacuum chamber and holding at that temperature for one hour. In performing the invention a range of heat treatment temperatures may be used from 1100° C. to 1200° C. inclusive, according to the solution heat treatment temperature normally used for the superalloy article 26. Although different diffusion times could be used, for example up to six hours may be used, it was judged that one hour was sufficient at this range of temperatures for the platinum to be properly combined with the superalloy substrate 27 without prematurely aging the superalloy substrate 27.

Figure 4:
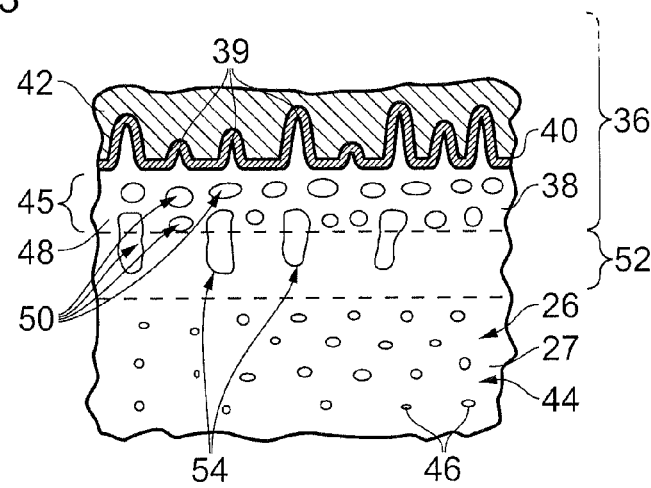
FIG. 4 is a further enlarged diagrammatic cross-sectional through the thermal barrier coated metallic article shown in FIG. 3.

The microstructure of the superalloy substrate 27 generally comprises two phases, as seen more clearly in FIG. 4, these being a gamma phase matrix 44 and a gamma prime phase 46 in the gamma phase matrix 44. The gamma prime phase 46 forms a reinforcement in the gamma phase matrix 44. The heat treatment of the platinum layer 38 on the superalloy substrate 27 causes aluminium in the superalloy substrate 27 to be diffused outwards towards the platinum layer 45 on the surface of the superalloy substrate 27. This results in the formation of a platinum enriched gamma phase 48 and a platinum enriched gamma prime phase 50 in the outer surface layer of the superalloy article 26. The aluminium in the platinum enriched outer surface layer 38 of the superalloy article 26 is available for formation of alumina 40. It is to be noted that the region 52 of the superalloy article 26 immediately below the platinum enriched outer surface layer 38 does not have any gamma prime phase 46. The heat treatment causes the aluminium in this gamma prime phase to move to the platinum layer 38 and hence breaks down the gamma prime phase due to aluminium's greater chemical affinity for platinum. It is to be noted that some of the regions of platinum enriched gamma prime phase 50 in the platinum enriched outer surface layer 38 have distinct promontories, or pegs, which have grown inwardly into the region 52 of the superalloy article 26. It is believed that these platinum enriched gamma prime phase pegs 54 grow into the superalloy article 26 and draw the aluminium from the gamma prime phase regions in the superalloy article 26. Thus it can be seen that the platinum in the platinum layer only diffuses into the superalloy article 26 in these distinct platinum enriched gamma prime pegs 54, rather than as a continuous band of platinum. The extent of growth of the platinum enriched gamma prime pegs 54 is sensitive to the thickness of the platinum layer and the diffusion temperature. The platinum levels in the platinum enriched gamma prime phase 48 and the platinum enriched gamma phase 50 are about equal, showing that both of these phases are equally favoured. It is also to be noted that if there is sufficient aluminium in the superalloy article a continuous platinum enriched gamma prime phase forms on a platinum enriched gamma phase matrix containing platinum enriched gamma prime phases. Furthermore there is always a layer of platinum enriched gamma phase immediately underneath the alumina layer as platinum enriched gamma prime phase breaks down to the platinum enriched gamma phase when it loses aluminium to form alumina. To enhance the thermal barrier coating adhesion to the superalloy article 26 it is desirable to ensure phase stability within the platinum enriched gamma phase 48 and the platinum enriched gamma prime phase 50. The stability is achieved by appropriate selection of the platinum thickness within the specified heat treatment temperature range of above 1100° C. to 1200° C. In addition it is important to ensure that any phase changes which occur in operation, within a gas turbine engine, result in small volume changes. This is achieved by control of the composition of the platinum enriched gamma phase 48 and platinum enriched gamma prime phase 50. The composition of the platinum enriched gamma and platinum enriched gamma prime phases are balanced, i.e. the compositions are closely matched, and any changes from the platinum enriched gamma prime phase to the platinum enriched gamma phase only results in small volume changes.

Figure 7:
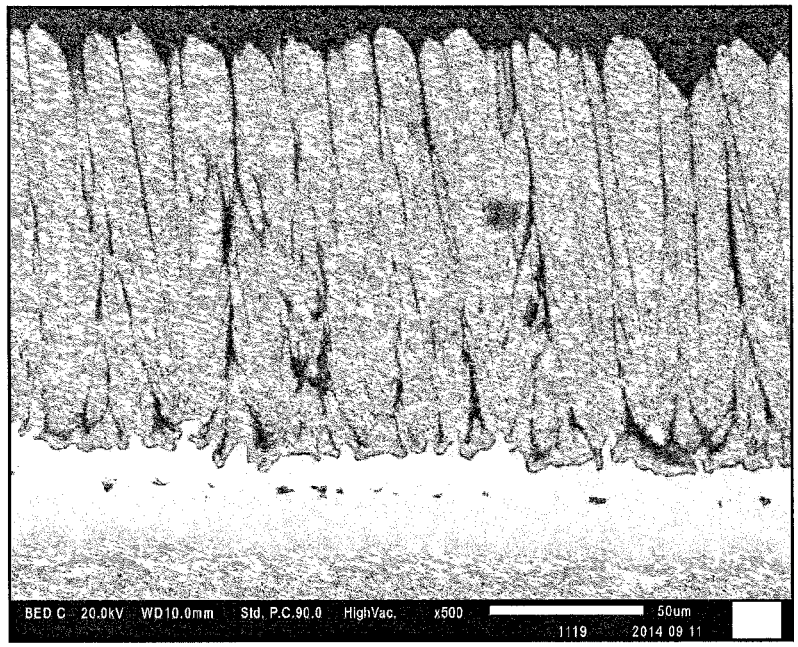
FIG. 7 is a cross-sectional micro-photograph of a thermal barrier coated metallic according to the present disclosure.
Figure 8:
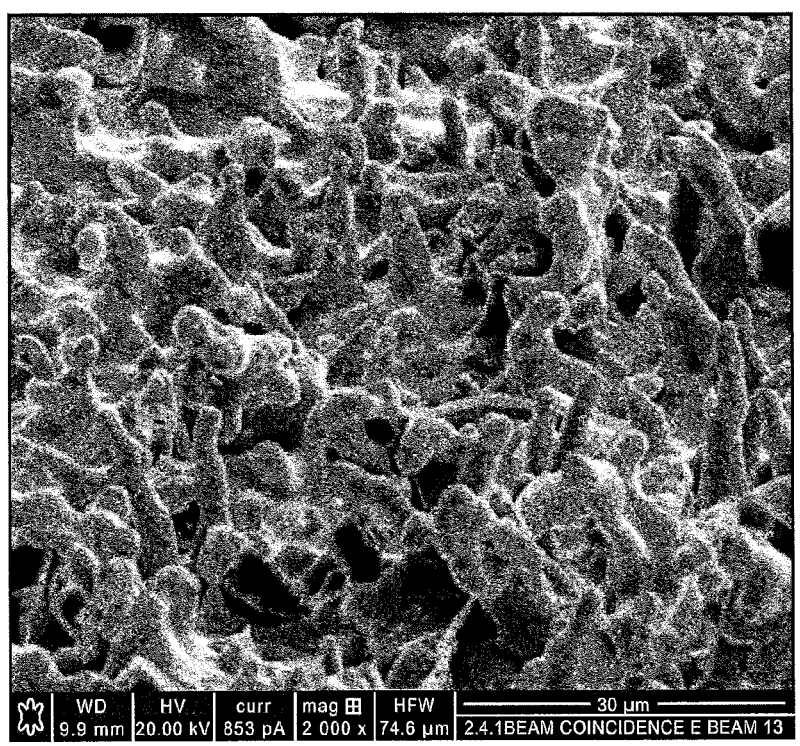
FIG. 8 is a micro-photograph of the surface of the bond coating of a thermal barrier coated metallic article according to the present disclosure.

After heat treatment the platinum enriched surface layer 38 has a microstructure comprising an irregular surface including a plurality of projections, protuberances or spikes, 39 extending away from the superalloy article 26, as clearly seen in FIG. 8. It is believed that the electroplating process produces crystals which extend away from the surface of the superalloy article 26 and the subsequent heat treatment causes the crystals to become more rounded to form the projections 39. A layer of a ceramic 42 consisting of partially stabilized zirconia (in this case, zirconia containing 8% by weight of yttria) was applied by electron beam physical vapour deposition (EBPVD). This ceramic coating is available from Turbine Surface Technology Limited (UK), Unit 13A, Little Oak Drive, Annesley, Nottinghamshire, NG15 0DR, United Kingdom. For the electron beam physical vapour deposition (EBPVD) process, the superalloy article 26 was initially held in a preheating chamber and preheated to a temperature of about 1000° C. at a pressure of about $10^{-5}$ Torr ($1.33 \times 10^{-3}$ Pascals). It was then immediately transferred to an electron beam coating chamber, where it continued to be held for coating at 1000° C. at a pressure of $10^{-2}$ to $10^{-3}$ Torr (1.33 to 0.133 Pascals), in an atmosphere consisting of argon and oxygen. The presence of oxygen at an elevated temperature during the EBPVD coating process made it inevitable that a thin oxide layer 40 formed on the surface of the platinum enriched outer layer 38 of the superalloy article 26 which comprises the platinum enriched gamma phase 48 and platinum enriched gamma prime phase 50. The oxide layer 40 was covered by the ceramic layer 42 and the oxide layer 40 predominantly comprises alumina. The superalloy article 26, the platinum enriched surface layer 38, the thermally grown oxide layer 40 and the ceramic coating 42 are shown in FIG. 7. FIGS. 3 and 7 also show the irregular surface including the projections, protuberances or spikes, 39 on the platinum enriched surface layer 38 and the columnar ceramic grains 41 and 43 in the ceramic coating 42. The columnar ceramic grains 41 and 43 extend substantially perpendicularly to the surface of the superalloy substrate 27 from the oxide layer 40. The thin oxide layer 50 has a thickness of about 0.5 μm as manufactured, but may be up to about 1 μm depending upon the manufacturing process. The ceramic coating 42 has a thickness of typically between 50 μm and 200 μm but may taper to zero thickness at regions where a ceramic coating is not required.

The columnar ceramic grains 41 and 43 of the ceramic coating 42 nucleate on the oxide layer 40 and start to grow substantially perpendicularly to the surface of the superalloy article 26. The columnar ceramic grains 41 and 43 grow competitively and the columnar ceramic grains 41 grow through the full thickness of the ceramic coating 42 whereas the columnar ceramic grains 43 are blocked out at various distances from the oxide layer 40 by the columnar ceramic grains 41. The columnar ceramic grains 41 nucleate on and grow from the oxide layer, e.g. alumina, 40 on the projections 39 on the platinum enriched surface layer 38 whereas the columnar ceramic grains 43 nucleate on and grow from the oxide layer, e.g. alumina, 40 on the surface of the platinum enriched surface layer 38 surrounding the projections 39. In some instances columnar ceramic grains 43 nucleating and growing from projections 39 are blocked out by columnar ceramic grains 41 growing from adjacent projections 39 which extend by greater distances from the oxide layer 40 on the surface of the platinum enriched surface layer 38. It is believed that the columnar ceramic grains 43 are blocked out by the columnar ceramic grains 41 because the columnar ceramic grains 41 nucleate at smaller distances, due to the columnar ceramic grains 41 nucleating on the projections 39, from the source of the ceramic than the columnar ceramic grains 43. In some instances clusters of one or more columnar ceramic grains 41 nucleating and growing from the oxide layer 40 on the surface of the platinum enriched surface layer 38 surrounding the projections 39 extend through the full thickness of the ceramic coating 42. Therefore, it is believed that there is a smaller distance in the ceramic coating 42 through which competitive grain growth occurs compared to a conventional ceramic coating. Thus, the projections 39 affect the initial competitive growth in the ceramic coating 42 and the majority of the columnar ceramic grains 41 that grow through the full thickness of the ceramic coating 42 emanate from a respective one of the projections 39. There are generally one or more columnar ceramic grains 41 growing from each projection 39 and thus the columnar ceramic grains 41 growing together from the respective projection 39 are arranged in a cluster 45 of columnar ceramic grains 41. These clusters 45 of columnar ceramic grains 41 are separated by more significant, evident, gaps 47. Thus, the projections 39 provide these more significant, evident, gaps 47 between the clusters 45 of columnar ceramic grains 41 in the ceramic coating 42. There may be less significant, smaller, clearances between the columnar ceramic grains 41 in each cluster 45 of columnar ceramic grains 41 in the ceramic coating 42. It is postulated that it is the clusters 45 of columnar ceramic grains 41 and in particular the separations 47 between the clusters 45 of columnar ceramic grains 41 in the ceramic coating 42 which reduces the stored elastic energy in the thermal barrier coating system, e.g. reducing the stress in the oxide layer 40 and the stress in the ceramic coating 42. Linear defects are produced in the ceramic coating 42 by the projections 39 and the clusters 45 of columnar ceramic grains 41 extending from the projections 39. Whereas, in a ceramic coating produced conventionally the columnar ceramic grains are tightly packed together with only the small clearances between the columnar ceramic grains and very few clusters of columnar ceramic grains.

Figure 5:
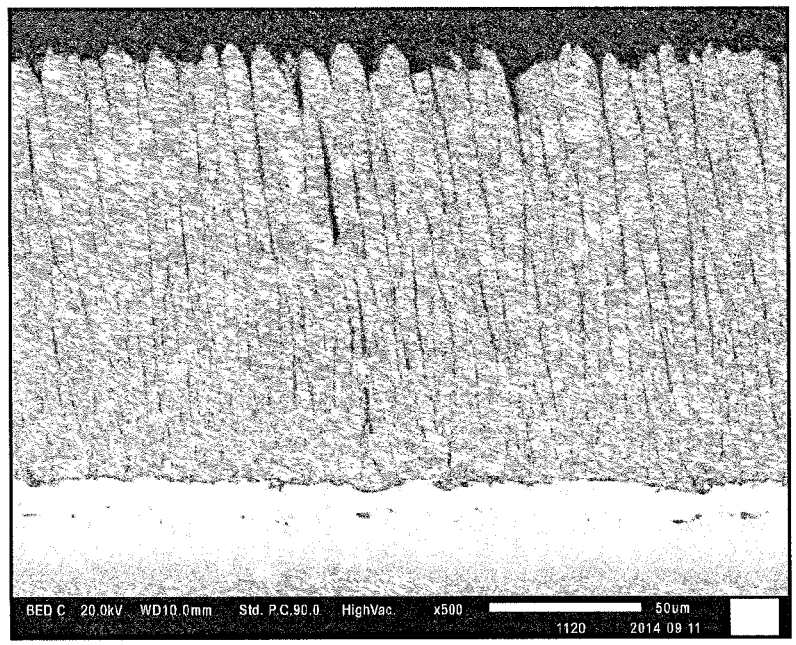
FIG. 5 is a cross-sectional micro-photograph of a thermal barrier coated metallic according to the prior art.
Figure 6:
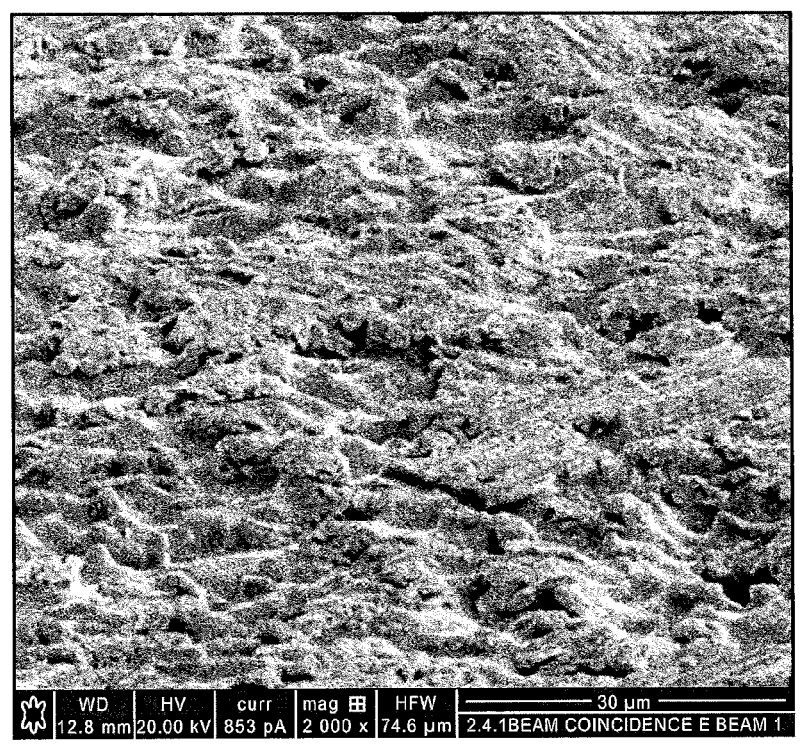
FIG. 6 is a micro-photograph of the surface of the bond coating of a thermal barrier coated metallic article according to the prior art.

In the conventional method of producing a thermal barrier coated superalloy article, the method has further steps of grit blasting the platinum enriched surface layer after the heat treatment step and before the ceramic coating is deposited. This additional step is conventionally used to make the bond coating smoother to improve adherence of the ceramic coating. FIG. 6 shows the surface of the platinum enriched surface layer after grit blasting and FIG. 5 shows the superalloy article, the platinum enriched surface layer, the thermally grown oxide layer and the ceramic coating. FIG. 5 also shows a more regular surface on the platinum enriched surface layer and columnar ceramic grains in the ceramic coating. The columnar ceramic grains also extend substantially perpendicularly to the surface of the superalloy substrate.

In a series of tests a first set of samples of nickel based superalloy CMSX4 were electroplated with 12.5 μm of platinum, heat treated at 1150° C. for 1 hour and then coated with yttria stabilised zirconia by electron beam physical vapour deposition and a second set of samples of nickel based superalloy CMSX4 were electroplated with 12.5 μm of platinum, heat treated at 1150° C. for 1 hour, then grit biased with dry alumina powder of 120 to 220 μm size and then coated with the same thickness of yttria stabilised zirconia by electron beam physical vapour deposition. These two sets of samples were then subjected to cyclic oxidation testing in air at a temperature of 1190° C. Each cycle lasted for 3 hours including heating to a temperature of 1190° C. in a furnace, taking about 0.25 hour, holding in the furnace at a temperature of 1190° C. for 2.75 hours and then air cooling to ambient temperature. After each 3 hour cycle the samples were hydrated with water at ambient temperature and then inspected to see if any cracks had formed in the ceramic coating. Each sample was repeatedly subjected to the 3 hour cycles until inspection of the sample revealed that the ceramic coating on 50% of the sample had spalled.

Figure 10:
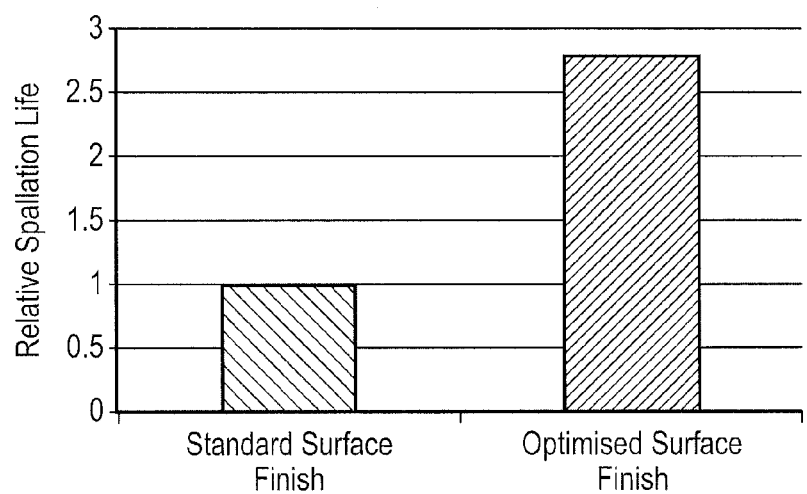
FIG. 10 is a bar chart showing the relative spallation life for a thermal barrier coating according to the present disclosure and a prior art thermal barrier coating.
Figure 11:
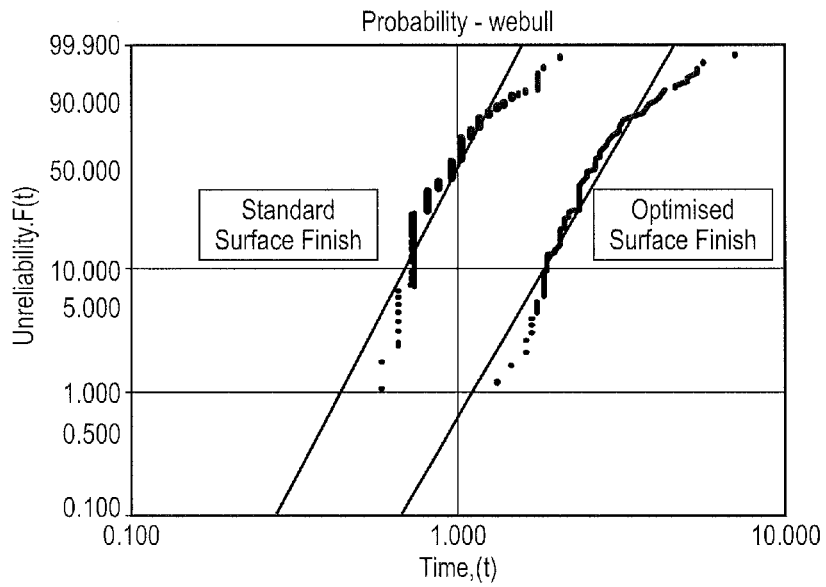
FIG. 11 is a Weibull Distribution for coating life tested at 1190° C. for a thermal barrier coating according to the present disclosure and a prior art thermal barrier coating.

The results of the test are shown in FIGS. 10 and 11. The Weibull distribution for thermal barrier coating (TBC) life is provided in FIG. 11 and this clearly indicates that the working life of a thermal barrier coating (TBC) according to the present disclosure is better than a conventional thermal barrier coating in the cyclic oxidation testing conducted at 1190° C. The Weibull distribution for thermal barrier coating life in FIG. 10 has a large number of data points from tested samples covering manufacturing variations. The average relative spallation life for a thermal barrier coating (TBC) is provided in FIG. 10 and this clearly indicates that on average a thermal barrier coating (TBC) according to the present disclosure has a spallation life more than 2.5 times that of a conventional thermal barrier coating in the cyclic oxidation testing conducted at 1190° C.

As mentioned previously the resultant microstructure of the platinum enriched surface layer 38 comprises a frequent periodicity of projections, protuberances or spikes, 39 in the diffused condition, as seen in FIGS. 7 and 8. These projections, protuberances or spikes, 39 have the effect of both reducing the stress in the ceramic coating 42 near the interface with the thermally grown oxide 40 resulting in a reduced stress in the thermally grown oxide 40, and in addition directing any propagating delamination cracks away from the bulk interface, resulting in an improved ceramic coating 42 spallation performance. The three dimensional (3D) nature of the microstructure of the platinum enriched surface layer 38, denoted by "optimised surface finish" has the effect of significantly reducing the stress in the thermally grown oxide, alumina, 40 by a factor of about two when compared with the conventional method of grit blasting, denoted as "standard surface finish" in FIG. 9. The oxide layer 40 on the "optimised surface finish" has an as formed stress of much less than 3.0 GPa, less than 2.5 GPa and is approximately 2.0 GPa, whereas the oxide layer on the "standard surface finish" has an as formed stress of more than 3.0 GPa. In both cases the stress in the oxide layer increases with time to a peak after about 10 hours and then is at a reduced level for times up to about 60 hours. The stress in the oxide with "optimised surface finish" reduces to a level below 3.0 GPa, approximately 2.5 GPa, whereas the stress in the oxide with "standard surface finish" reduces to a level of approximately 4.0 GPa over this time period. The stress in the thermally grown oxide is measured using the techniques described by "Lipkin D M, Clarke D R in Measurement of the Stress in Oxide Scales Formed by Oxidation of Alumina-Forming Alloys", Oxidation of Metals 1996; 45:267-280.

Figure 9:
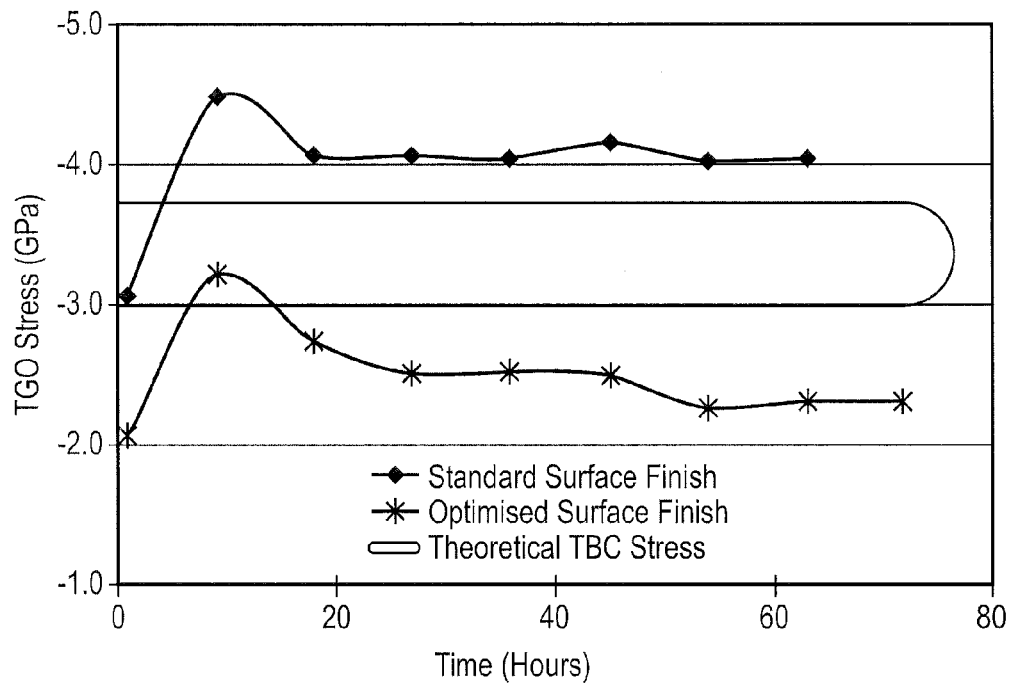
FIG. 9 is a graph comparing the stress in the oxide layer against time for a thermal barrier coating according to the present disclosure and a prior art thermal barrier coating.

The oxide, alumina, layer 40 forms on the bond coating, e.g. the platinum enriched surface layer, 38 including the projections, protuberances or spikes, 39 and the oxide layer grows, thickens in use during operation at high temperatures. It is postulated firstly that the projections 39 on the bond coating 38 reduce the stress in the as formed oxide, alumina, layer 40 and secondly that the projections 39 on the bond coating 38 reduce the rate at which the stress in the oxide, alumina, layer 40 increases with time operating at high temperatures, as illustrated by FIG. 9.

One contributing factor to this reduction in thermally grown oxide (TGO) stress is the presence of the linear defects produced in the outer EB-PVD ceramic coating 42 by the projections, protuberances or spikes, 39 in the bond coating, e.g. the platinum enriched surface layer 38, which act to reduce the stored elastic energy in the thermal barrier coating (TBC) system. These two factors taken together improve the mean life to spallation of the EB-PVD ceramic coating 42 by a factor of ×2.7 as illustrated in FIG. 10.

Figure 12:
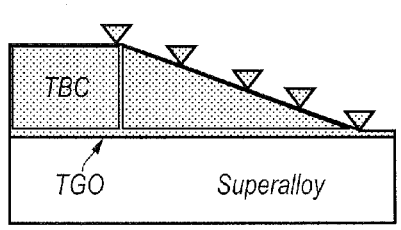
FIG. 12 is a diagrammatic representation to indicate how the stress gradient is measured in the oxide layer and the ceramic layer of a thermal barrier coating.

In a series of tests a first sample of nickel based superalloy CMSX4 was electroplated with 12.5 µm of platinum, heat treated at 1150° C. for 1 hour and then coated with yttria stabilised zirconia by electron beam physical vapour deposition and a second sample of nickel based superalloy CMSX4 was electroplated with 12.5 µm of platinum, heat treated at 1150° C. for 1 hour, then grit blasted with dry alumina powder or 120 to 220 µm size and then coated with the same thickness of yttria stabilised zirconia by electron beam physical vapour deposition. These two set samples were then subjected to five thermal exposures in air at a temperature of 1190° C. Each cycle lasted 3 hours including heating to a temperature of 1190° C. in a furnace, taking about 0.25 hours, holding in the furnace at a temperature of 1190° C. for 2.75 hours and then air cooling to ambient temperature. The two samples were then mechanically abraded at an oblique angle to the surface to provide a wedge section, as shown in FIG. 12, and then the stress in the ceramic coating was measured. The stress in the ceramic coating 42 was measured using the techniques described by "Zhao X, Xiao P in Residual Stresses in Thermal Barrier Coatings Measured by Photoluminescence Piezospectroscopy and Indentation Technique", Surface and Coatings Technology; 201:1124-1131.

Figure 13:
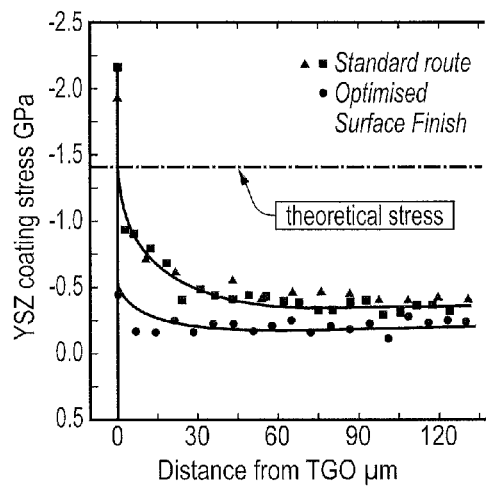
FIG. 13 is a graph comparing the stress in the ceramic layer against distance from the oxide layer for a thermal barrier coating according to the present disclosure and a prior art thermal barrier coating.

The impact that the projections, or spikes, 39 on the bond coating, e.g. the platinum enriched surface layer 38, has on the stored energy in the ceramic coating 42 is illustrated in FIG. 13. With the conventional approach the stress gradient through the ceramic coating extends for approximately 30 µm from the thermally grown alumina layer. In the case of the platinum enriched surface layer 38 with the projections, or spikes, 39 the stress gradient through the ceramic coating 42 extends for approximately 10 µm from the thermally grown alumina layer 40. The difference in the stored energy in the ceramic coating 42 is denoted by the shaded zone in FIG. 13. FIG. 13 clearly shows that the stress in the ceramic coating produced by the conventional method is much greater than that produced using the method according to the present disclosure. The ceramic coating 42 has a stress of less than 0.25 GPa at distances greater than 30 µm from the oxide layer 40 and a stress of about 0.50 GPa at the oxide layer 40 as seen in FIG. 13.

The projections have inner ends nearest to the superalloy substrate and outer ends remote from the superalloy substrate. FIGS. 7 and 8 shows that some of the projections extend between 10 µm and 25 µm from their inner ends immediately adjacent to the surface of the platinum enriched surface layer to their outer ends remote from the superalloy substrate. Other shorter projections extend for ups to 10 µm and some longer projections extend more than 25 µm from their inner ends immediately adjacent to the surface of the platinum enriched surface layer to their outer ends remote from the superalloy substrate. The projections have transverse dimensions of between 7 µm and 12 µm at their inner ends and transverse dimensions at positions intermediate their inner ends and outer ends of between 2 µm and 7 µm. Thus, the projections have lengths from their inner ends to their outer ends which are longer than their transverse dimensions, diameters, or widths. The projections are randomly distributed over the surface of the platinum enriched surface layer and the projections have a variation in their lengths.

In another series of tests samples of nickel based superalloy CMSX4 were electroplated with 12.5 µm of platinum, were heat treated at 1150° C. for 1 hour and then the surface roughness of the samples was then measured. The samples were found to have surface roughness Sa of 1.6 µm, 2.6 µm and of 3 µm. Some samples with a surface roughness Sa of 1.6 µm, 2.6 µm and of 3 µm were then coated with yttria stabilised zirconia by electron beam physical vapour deposition. Some of the samples with a surface roughness Sa of 1.6 µm, 2.6 µm and of 3 µm were then grit biased with dry alumina powder of 120 to 220 µm size and then coated with the same thickness of yttria stabilised zirconia by electron beam physical vapour deposition. Then the number of clusters of columnar ceramic grains at the surface of the ceramic coating was measured for each sample.

Figure 14:
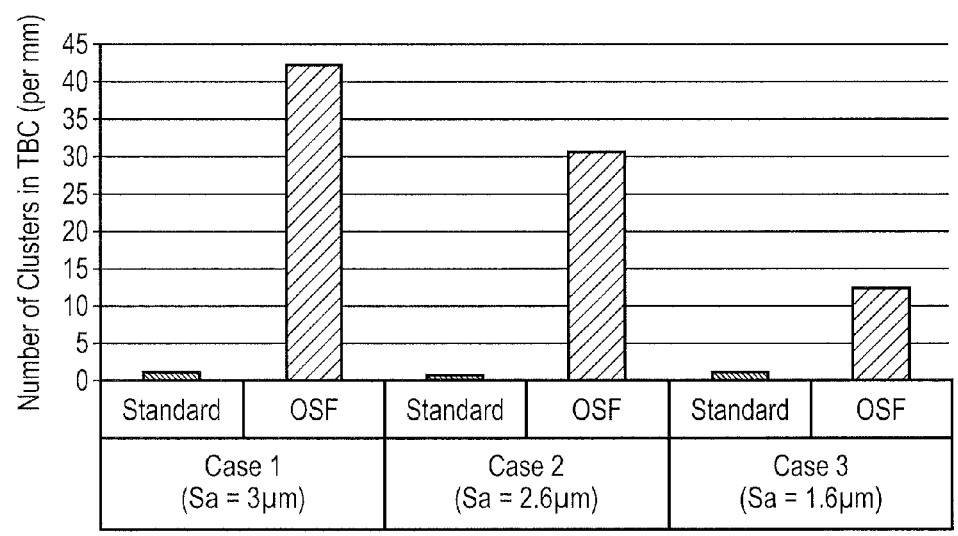
FIG. 14 is a bar chart comparing the number of clusters of columnar ceramic grains in a thermal barrier coating according to the present disclosure and the number of clusters of columnar ceramic grains in a thermal barrier coating according to the prior art with surface roughness of the bond coating.

FIG. 14 compares the number of clusters of columnar ceramic grains, measured in a straight line, per mm at the surface of the ceramic coating for a thermal barrier coating according to the present disclosure and for a thermal barrier coating according to the prior art. The surface roughness figures indicated in FIG. 14 refer to the surface roughness of the bond coating after the platinum has been electroplated onto and diffused into the CMSX4 to form the platinum enriched outer layer on the nickel superalloy. The prior art indicated by "standard" was then grit blasted whereas the "OSF" retains the projections on the platinum enriched. In the case of a thermal barrier coating according to the prior art, indicated as "standard", the number of clusters of columnar grains per mm remains substantially the same for a surface roughness Sa of 1.6 µm, 2.6 µm and of 3 µm before the grit blasting. In the case of a thermal barrier coating according to the present disclosure, indicated as "OSF" the number of clusters of columnar grains per mm increases from a surface roughness Sa of 1.6 µm to a surface roughness Sa of 2.6 µm and again increases from a surface roughness Sa of 2.6 µm to a surface roughness Sa of 3 µm. FIG. 14 clearly shows that there is a greater number of clusters of columnar ceramic grains in a thermal barrier coating according to the present disclosure compared to a thermal barrier coating according to the prior art. Thus, because the thermal barrier coating according to the present disclosure has a greater number of clusters of columnar ceramic grains, and hence a greater number of gaps between clusters of columnar ceramic grains, there is less stress in the ceramic coating and the ceramic coating is more able to accommodate strains in the ceramic coating. There are between 10 and 45 clusters of columnar ceramic grains per mm at the surface of the ceramic coating as seen for all three cases and there are between 30 and 43 clusters of columnar ceramic grains per mm at the surface of the ceramic coating for cases 1 and 2. Thus, there is an order of magnitude difference in the number of clusters of columnar ceramic grains per mm at the surface of the ceramic coating in a thermal barrier coating according to the present disclosure compared to a thermal barrier coating according to the prior art.

The superalloy article may comprise CMSX4 a nickel based superalloy. CMSX4 is a trade name of the Cannon-Muskegon Corporation of 2875 Lincoln Street, Muskegon, Michingan, Mich. 49443-0506, USA. CMSX4 has a nominal composition of 6.4 wt % tungsten, 9.5 wt % cobalt, 6.5 wt % chromium, 3.0 wt % rhenium, 5.6 wt % aluminium, 6.5 wt % tantalum, 1.0 wt % titanium, 0.1 wt % hafnium, 0.6 wt % molybdenum, 0.006 wt % carbon and the balance nickel plus incidental impurities. The superalloy article may comprise low sulphur CMSX4 which has the same nominal composition but has less than 1 ppm by weight sulphur and preferably has less than 0.5 ppm by weight sulphur. The superalloy article may be a cobalt alloy, or an iron superalloy, a low sulphur cobalt superalloy or a low sulphur iron superalloy. The advantage of using a low sulphur superalloy article is that it provides a further increase in the working life of the ceramic coating.

The present disclosure improves the life of a thermal barrier coated metallic, superalloy, article by optimising the surface of the bond coating by promoting changes in the stress state in the oxide, alumina, bonding layer and the stress state in the ceramic coating. In particular the present disclosure improves the life of a thermal barrier coated metallic, superalloy, article by reducing the stress in the as formed oxide, alumina, bonding layer and by reducing the stress in the as formed ceramic coating. A further advantage, in some instances of the present disclosure, is that it reduces the number of manufacturing steps and hence reduces manufacturing time and manufacturing costs, e.g. eliminates the need for grit blasting the surface of a platinum-group metal coated bond coating.

Although the present disclosure has been described with reference to simply providing a platinum enriched surface layer on the superalloy substrate it may be equally possible to provide an overlay coating, e.g. a MCrAlY coating, on the superalloy substrate, by plasma spraying or other suitable method, and then heat treating the overlay coating to bond the overlay coating onto the superalloy article, where M is one or more of nickel, cobalt or iron, Cr is chromium, Al is aluminium and Y is one or more of yttrium ytterbium, lanthanum and other rare earth metals. A layer of platinum is applied on the overlay coated superalloy substrate, by electroplating or other suitable method, and then the overlay coated superalloy article is heat treated to diffuse the platinum into the overlay coated superalloy article to create a platinum enriched outer layer on the overlay coated superalloy article. Preferably the overlay, MCrAlY, coating is polished before the layer of platinum is applied. Finally a ceramic coating is applied to the platinum enriched outer layer on the overlay coating by electron beam physical vapour deposition. The platinum enriched outer layer on the overlay coating may comprise platinum enriched overlay, MCrAlY, layer and a platinum aluminide layer as described more fully in European patent application EP0718419A. The MCrAlY coating may be a MCrAlY coating comprising gamma and gamma prime phases, a MCrAlY coating comprising beta and gamma phases or a MCrAlY coating comprising beta phase.

Although the present disclosure has been described with reference to simply providing a platinum enriched surface layer on the metallic, superalloy, substrate it may be equally possible to subsequently deposit a layer of aluminium on the platinum enriched outer layer on the superalloy article, by pack aluminising, vapour aluminising, slurry aluminising or other suitable method, and then heat treating the aluminium coated platinum enriched outer layer on the superalloy article to inter-diffuse the aluminium and platinum enriched outer layer on the superalloy article to create a platinum aluminide coating on the superalloy article before the ceramic coating is deposited onto the thin oxide layer on the platinum enriched outer layer on the superalloy article.

Although the present disclosure has been described with reference to providing a layer of platinum onto the surface of the metallic, superalloy, substrate, it is equally possible to provide a layer of any platinum-group metal, for example palladium, rhodium, iridium, however platinum is the preferred platinum-group metal. It may be possible to use a combination of two or more of the platinum-group metals, for example platinum and rhodium, platinum and palladium or palladium and rhodium etc.

The present disclosure may also provide projections on the surface of any suitable bond coating by forming the projections after the bond coating has been deposited onto the surface of the metallic, superalloy, article. The bond coating may be an overlay coating, for example a MCrAlY coating where M is one or more of nickel, cobalt or iron, Cr is chromium, Al is aluminium and Y is yttrium. The bond coating may be an overlay coating, for example a MCrAlY coating where M is one or more of nickel, cobalt or iron, Cr is chromium, Al is aluminium and Y is one or more of yttrium, ytterbium, lanthanum and other rare earth metals having a platinum-group metal enriched outer surface layer. Alternatively the bond coating may be a diffusion aluminide coating, for example an aluminide coating or a platinum aluminide. The projections may be formed by power beam sculpturing, e.g. electron beam sculpturing, laser beam sculpturing or ion beam sculpturing, of the surface of the bond coating to provide a plurality of projections of suitable dimensions. The power beam is used to locally melt, displace and re-solidify bond coating material produced by the relative movement of the power beam over the surface of the bond coating. The surface of the bond coating may comprise a pattern of projections, or protuberances, formed from the locally melted, displaced and re-solidified material. For example, the projections may be formed as an array of upstanding columns of re-solidified material. The pattern or array of projections may be a regular pattern or regular array. The projections may have lengths, extending away from the surface of the bond coating, in the range from 10 to 20 µm, and/or have transverse dimensions, diameters or widths in the range from 1 to 10 µm, although typically the length of each projection is greater than its transverse dimension, diameter or width. It may be possible to use other suitable methods of providing projections on the surface of a suitable bond coating after the bond coating has been deposited onto the surface of the metallic, superalloy, article.

Although the present disclosure has been described with reference to providing projections on bond coatings on metallic, superalloys, it may be equally possible to provide the projections directly onto the surface of the metallic, superalloy, article and to form an oxide, alumina, bonding layer on the surface and on the projections on the metallic, superalloy, article. The ceramic coating is then deposited on the oxide, alumina, bonding layer on the metallic, superalloy, article. This approach may be used if the metallic, superalloy, article may be provided with a ceramic coating without the use of an intervening bond coating, e.g. for metallic, superalloys, which have sufficient aluminium to form an oxide, alumina, bonding layer. The projections may be formed by power beam sculpturing, e.g. electron beam sculpturing, laser beam sculpturing or ion beam sculpturing, of the surface of the metallic, superalloy, article to provide a plurality of projections of suitable dimensions. The power beam is used to locally melt, displace and re-solidify metallic, superalloy, material produced by the relative movement of the power beam over the surface of the metallic, superalloy, article. The surface of the metallic, superalloy, article may comprise a pattern of projections, or protuberances, formed from the locally melted, displaced and re-solidified material. For example, the projections may be formed as an array of upstanding columns of re-solidified material. The pattern or array of projections may be a regular pattern or regular array. It may be possible to use other suitable methods of providing projections on the surface of the metallic, superalloy, article. The projections may have similar dimensions to those described in the previous paragraph.

Although the present disclosure has been described with reference to the use of electron beam physical vapour deposition (EBPVD) to produce columnar ceramic grains in the ceramic coating it is possible to use any other suitable physical vapour deposition process which produces columnar ceramic grains in the ceramic coating, e.g. plasma assisted electron beam physical vapour deposition (PAEB-PVD), a combination of electron beam physical vapour deposition and plasma assisted electron beam physical vapour deposition to produce layers in the columnar ceramic grains, plasma spray physical vapour deposition (PSPVD) or directed vapour deposition (DVD). The present disclosure is also applicable to any other deposition process which produces columnar ceramic grains in the ceramic coating, e.g. solution precursor plasma spraying (SPPS) or suspension plasma spraying (SPS).

Although the present disclosure has been described with reference to a ceramic coating comprising yttria stabilised zirconia, it is equally applicable to other suitable ceramic coatings, for example zirconia stabilised with one or more other ceramics e.g. yttria and erbia stabilised zirconia, yttria and gadolinia stabilised zirconia or yttria, erbia and gadolinia stabilised zirconia.

Although the present disclosure has been described with reference to a metallic, superalloy, article for a turbofan gas turbine engine it is equally applicable to a metallic, superalloy, article for a turbojet gas turbine engine, a turbopropeller gas turbine engine or a turbo-shaft gas turbine engine and is applicable to aero gas turbine engines, marine gas turbine engines, automotive gas turbine engines or industrial gas turbine engines. The present disclosure is equally applicable to metallic, superalloy, articles for other turbomachines, e.g. steam turbines or other apparatus requiring metallic, superalloy, articles with thermal barrier coatings.

The invention claimed is:
1. A method of applying a thermal barrier coating to a metallic article comprising the steps of:
   (a) providing a plurality of projections extending away from the surface of the metallic article,
   (b) creating a thin adherent layer of oxide on the metallic article, and
   (c) applying a ceramic coating to the oxide layer on the surface of the metallic article such that the ceramic coating deposits on the surface of the metallic article on and around the projections, applying the ceramic coating as a plurality of columnar ceramic grains extending substantially perpendicularly away from the metallic article, a plurality of the columnar ceramic grains nucleating on and extending from the oxide layer on the projections on the metallic article, a plurality of the columnar ceramic grains nucleating on and extending from the oxide layer around the projections on the metallic article, a plurality of the columnar ceramic grains extending from the oxide layer on the projections on the metallic article extending through the full thickness of the ceramic coating, a plurality of the columnar ceramic grains extending from the oxide layer around the projections on the metallic article only extending part way through the full thickness of the ceramic coating, one or more columnar ceramic grains growing from each projection, the columnar ceramic grains growing together from a respective one of the projections being arranged in a cluster of columnar ceramic grains and the clusters of columnar ceramic grains being separated by gaps,
   wherein step (a) comprises forming the plurality of projections by power beam sculpturing.

2. A method of applying a thermal barrier coating to a metallic article comprising the steps of:—
   (a) providing a plurality of projections extending away from the surface of the metallic article,
   (b) creating a thin adherent layer of oxide on the metallic article, and
   (c) applying a ceramic coating to the oxide layer on the surface of the metallic article such that the ceramic coating deposits on the surface of the metallic article on and around the projections, applying the ceramic coating as a plurality of columnar ceramic grains extending substantially perpendicularly away from the metallic article, a plurality of the columnar ceramic grains nucleating on and extending from the oxide layer on the projections on the metallic article, a plurality of the columnar ceramic grains nucleating on and extending from the oxide layer around the projections on the metallic article, a plurality of the columnar ceramic grains extending from the oxide layer on the projections on the metallic article extending through the full thickness of the ceramic coating, a plurality of the columnar ceramic grains extending from the oxide layer around the projections on the metallic article only extending part way through the full thickness of the ceramic coating, one or more columnar ceramic grains growing from each projection, the columnar ceramic grains growing together from a respective one of the projections being arranged in a cluster of columnar ceramic grains and the clusters of columnar ceramic grains being separated by gaps, wherein step (a) comprises providing a bond coating on the metallic article, the surface of the bond coating on the metallic article having a plurality of projections extending away from the metallic article, and the bond coating is deposited by applying the bond coating by electroplating and then heat treating the bond coating, step (b) comprises creating a thin adherent layer of oxide on the bond coating, and step (c) comprises applying a ceramic coating to the oxide layer on the surface of the bond coating.

3. The method of applying a thermal barrier coating to a metallic article as claimed in claim 2, further comprising the steps of:
(a-1) applying a layer of platinum-group metal to the metallic article, applying the platinum-group metal by an electroplating process, heat treating the platinum-group-metal coated metallic article to diffuse the platinum-group metal into the metallic article to create a platinum-group metal enriched outer layer on the metallic article, the surface of the platinum-group metal enriched outer layer on the metallic article having a microstructure comprising a plurality of projections extending away from the metallic article,
(b-1) creating a thin adherent layer of oxide on the platinum-group metal enriched outer layer of the metallic article, and
(c-1) applying a ceramic coating to the oxide layer on the surface of the bond coating such that the ceramic coating deposits on the surface of the bond coating on and around the projections, applying the ceramic coating as a plurality of columnar ceramic grains extending substantially perpendicularly away from the metallic article, a plurality of the columnar ceramic grains nucleating on and extending from the oxide layer on the projections on the bond coating, a plurality of the columnar ceramic grains nucleating on and extending from the oxide layer around the projections on the bond coating, a plurality of the columnar ceramic grains extending from the oxide layer on the projections on the bond coating extending through the full thickness of the ceramic coating, a plurality of the columnar ceramic grains extending from the oxide layer around the projections on the bond coating only extending part way through the full thickness of the ceramic coating, one or more columnar ceramic grains growing from each projection, the columnar ceramic grains growing together from a respective one of the projections being arranged in a cluster of columnar ceramic grains and the clusters of columnar ceramic grains being separated by gaps.

4. The method of applying a thermal barrier coating to a metallic article as claimed in claim 3, wherein at least some of the projections extend between 10 μm and 25 μm from the surface of the platinum enriched surface layer immediately adjacent to the projections.

5. The method of applying a thermal barrier coating to a metallic article as claimed in claim 3, wherein the metallic article comprises a superalloy substrate, the superalloy substrate comprises a gamma phase and gamma prime phase, the platinum-group metal enriched outer layer comprises a platinum-group metal enriched gamma phase and a platinum-group metal enriched gamma prime phase.

6. The method of applying a thermal barrier coating to a metallic article as claimed in claim 3, wherein the metallic article comprises a superalloy substrate and an overlay coating on the superalloy substrate, the superalloy substrate comprises gamma phase and gamma prime phase, the platinum-group metal enriched outer layer comprises a platinum-group metal enriched overlay layer and a platinum-group metal aluminide layer on the platinum-group metal enriched overlay layer.

7. The method of applying a thermal barrier coating to a metallic article as claimed in claim 3, wherein the heat treatment is carried out at a temperature in the range of 1100° C. to 1200° C. dependent upon the solution heat treatment temperature appropriate for the superalloy article.

8. The method of applying a thermal barrier coating to a metallic article as claimed in claim 3, wherein the platinum-group metal comprises platinum.

9. The method of applying a thermal barrier coating to a metallic article as claimed in claim 8, wherein the thickness of the layer of platinum as applied before heat treatment being greater than 3 μm and less than 12.5 μm.

10. The method of applying a thermal barrier coating to a metallic article as claimed in claim 3, wherein the ceramic coating is applied by a method selected from the group consisting of electron beam physical vapour deposition and plasma spray physical vapour deposition.

11. The method of applying a thermal barrier coating to a metallic article as claimed in claim 3, wherein the ceramic coating is selected from the group consisting of yttria stabilised zirconia, yttria and erbia stabilised zirconia, yttria and gadolinia stabilised zirconia and yttria, erbia and gadolinia stabilised zirconia.

12. The method of applying a thermal barrier coating to a metallic article as claimed in claim 3, comprising between and including 10 and 45 clusters of columnar ceramic grains per mm at the surface of the ceramic coating.

13. A method of applying a thermal barrier coating to a metallic article comprising the steps of:
(a) providing a plurality of projections extending away from the surface of the metallic article,
(b) creating a thin adherent layer of oxide on the metallic article, and
(c) applying a ceramic coating to the oxide layer on the surface of the metallic article such that the ceramic coating deposits on the surface of the metallic article on and around the projections, applying the ceramic coating as a plurality of columnar ceramic grains extending substantially perpendicularly away from the metallic article, a plurality of the columnar ceramic grains nucleating on and extending from the oxide layer on the projections on the metallic article, a plurality of the columnar ceramic grains nucleating on and extending from the oxide layer around the projections on the metallic article, a plurality of the columnar ceramic grains extending from the oxide layer on the projections on the metallic article extending through the full thickness of the ceramic coating, a plurality of the columnar ceramic grains extending from the oxide layer around the projections on the metallic article only extending part way through the full thickness of the ceramic coating, one or more columnar ceramic grains growing from each projection, the columnar ceramic grains growing together from a respective one of the projections being arranged in a cluster of columnar ceramic grains and the clusters of columnar ceramic grains being separated by gaps,
wherein step (a) comprises providing a bond coating on the metallic article and forming the plurality of projections on the bond coating, the surface of the bond coating on the metallic article having a plurality of projections extending away from the metallic article, the plurality of projections being formed by power beam sculpturing, step (b) comprises creating a thin adherent layer of oxide on the bond coating, and step (c) comprises applying a ceramic coating to the oxide layer on the surface of the bond coating.

14. The method of applying a thermal barrier coating to a metallic article as claimed in claim 2, wherein the ceramic coating is applied by a method selected from the group consisting of electron beam physical vapour deposition and plasma spray physical vapour deposition.

15. The method of applying a thermal barrier coating to a metallic article as claimed in claim 2, wherein the ceramic coating is selected from the group consisting of yttria stabilised zirconia, yttria and erbia stabilised zirconia, yttria and gadolinia stabilised zirconia and yttria, erbia and gadolinia stabilised zirconia.

16. The method of applying a thermal barrier coating to a metallic article as claimed in claim 2, comprising between and including 10 and 45 clusters of columnar ceramic grains per mm at the surface of the ceramic coating.

17. The method of applying a thermal barrier coating to a metallic article as claimed in claim 1, comprising between and including 10 and 45 clusters of columnar ceramic grains per mm at the surface of the ceramic coating.

18. The method of applying a thermal barrier coating to a metallic article as claimed in claim 13, comprising between and including 10 and 45 clusters of columnar ceramic grains per mm at the surface of the ceramic coating.

19. The method of applying a thermal barrier coating to a metallic article as claimed in claim 1, wherein step (a) further comprises forming the plurality of projections by one of electron beam sculpturing and laser beam sculpturing.

20. The method of applying a thermal barrier coating to a metallic article as claimed in claim 13, wherein step (a) further comprises forming the plurality of projections by one of electron beam sculpturing and laser beam sculpturing.

* * * * *